(12) United States Patent
Banks et al.

(10) Patent No.: US 6,219,747 B1
(45) Date of Patent: Apr. 17, 2001

(54) METHODS AND APPARATUS FOR VARIABLE LENGTH SDRAM TRANSFERS

(76) Inventors: Jano D. Banks, 19621 La Mar Ct., Cupertino, CA (US) 95014; Dale R. Adams, 3788 Rhoda Dr., San Jose, CA (US) 95117; Albert M. Scalise, 3107 Elaine Dr., San Jose, CA (US) 95124

( * ) Notice: Subject to any disclaimer, the term of this patent is extended or adjusted under 35 U.S.C. 154(b) by 0 days.

(21) Appl. No.: 09/226,776

(22) Filed: Jan. 6, 1999

(51) Int. Cl.[7] .................................................. G06F 12/00
(52) U.S. Cl. ............................. 711/105; 711/5; 711/158
(58) Field of Search ................................... 711/105, 158, 711/5

(56) References Cited

U.S. PATENT DOCUMENTS 5,715,476 * 2/1998 Kundu et al. .
5,721,860 * 2/1998 Stolt et al. .
5,812,472 * 9/1998 Lawrence et al. .................... 365/201

OTHER PUBLICATIONS

Micron Technology Inc., *Technical Note, Achieve Maximum Compatibility In SDRAM/SGRAM Design*, Compatibility in SDRAM/SGRAM Design, May, 1997.

Micron Technology Inc., *Synchronous DRAM*, 16 MEG: x16 SDRAM, Oct. 1997.

* cited by examiner

*Primary Examiner*—Jack A. Lane
(74) *Attorney, Agent, or Firm*—Hickman Coleman & Hughes, LLP

(57) ABSTRACT

Disclosed is a SDRAM system including a SDRAM having multiple banks of memory, a plurality of bank state machines associated the multiple banks of memory of the SDRAM, and a data control state machine. The data state machine is responsive to a memory request for a variable length data transfer with the SDRAM and as well as the bank state machines. The data control state machine determines the current state of a first bank of memory of the SDRAM. The current state may be either a read in progress, a write in progress, or idle. The data control state machine then handles the memory request with a different bank of memory RAM depending upon the current state of the first bank of memory.

25 Claims, 21 Drawing Sheets

METHODS AND APPARATUS FOR VARIABLE LENGTH SDRAM TRANSFERS

CROSS REFERENCE TO RELATED APPLICATIONS

This application is related to co-pending U.S. patent application Ser. No. 09/227,502 entitled Methods And Apparatus For Data Bus Arbitration filed on Jan. 6, 1999, which is incorporated herein by reference.

BACKGROUND OF THE INVENTION

1. Field of the Invention

The present invention relates generally to synchronous dynamic random access memory (SDRAM) technology and more particularly, to techniques for optimizing the operation of a SDRAM for variable length data transfers.

2. Description of the Related Art

Dynamic random access memory (DRAM) is used to provide a number of different functions in computers including: "scratch pad" memory and video frame buffers. A synchronous DRAM or SDRAM is designed to deliver bursts of data at very high speed using automatic addressing, multiple page interleaving, and a synchronous (or clocked) interface.

FIG. 1 is a block diagram illustrating a SDRAM 10 of the prior art. SDRAM 10 includes a control logic unit 12 that receives address, row address select (RAS), column address select (CAS), write enable (WE), and data input/output mask (DQM) assertions which control the operation of the SDRAM. Control logic unit 12 uses the assertions to control a number of memory banks ("banks") 14, which are labeled A–N. Banks 14 receive and transmit data through an output requestor 16 and an input requester 18 to a data bus 20.

FIG. 2A is a flow chart of a prior art method 22 of operating a SDRAM controller in a "fixed length" mode. Method 22 begins at an operation 24, where the SDRAM is programmed into the most common mode, the fixed length mode. A fixed length of transfer of 1, 2, 4, or 8 data phases is chosen during the mode register select (MRS) cycle. Then, an operation 26 optimizes the burst transfers for same bank transactions which is ideal for computer applications because computers process data in bursts that are often sequential and defined at a fixed length.

Optimization may include a SDRAM feature called auto refresh. Because SDRAM memory cells are capacitive, the charge they contain dissipates with time. As the charge is lost, so is the data in the memory cells. To prevent this from happening, SDRAMs must be refreshed by restoring the charge on the individual memory cells periodically. In addition, the SDRAM may use a feature called auto precharge, which allows the memory chip's circuitry to close a page automatically at the end of a burst. Auto precharge can be used because the burst transfers are of a fixed length, and it is known when the transfers will terminate.

FIG. 2B is a flow chart of a prior art method 28 of operating a SDRAM controller in "variable length" mode. Variable length mode is required in applications that do not use the 1, 2, 4, or 8 data phase transaction set available from the fixed mode. The method 28 begins with an operation 30 where the SDRAM is programmed in variable length mode. The variable length mode of the SDRAM, which is also known as full page length mode, is used to accommodate applications with long streams of data, such as those that are present in DMA and video. After the SDRAM is programmed, an operation 32 optimizes the burst transfers for multiple bank transactions.

FIG. 2C is a flow chart of a alternative prior art method 34 of operating a SDRAM controller in a variable length mode. The method 34 begins at operation 30 where the SDRAM is programmed in variable length mode. Then, an operation 36 optimizes the burst transfers for same bank transactions.

While the above methods 28 and 34 are adequately able to handle applications such as using DMA for a frame buffer or streaming data off of a disk drive system and buffering data into RAM, they are inefficient for applications where the length of the data bursts varies from short to long lengths. When the bursts vary between lengths, it becomes very difficult for the SDRAM to determine when to terminate the transaction.

Furthermore, methods 28 and 34 are also inefficient for applications that require the SDRAM to service multiple requestors. In such scenarios, prior art methods would only be able to handle one request at a time in same bank situations, forcing the other requests to wait, even as the SDRAM experiences idle cycles. In view of the foregoing, it is desirable to have methods and an apparatus that is able to optimizes the burst transfer lengths to requesters' different characteristics, and at the same time allowing the data bus to change to a different transaction with minimal idle time on the bus.

SUMMARY OF THE INVENTION

The present invention fills these needs by providing methods and an apparatus providing techniques for optimizing the operation of a SDRAM for variable length data transfers. It should be appreciated that the present invention can be implemented in numerous ways, including as a process, an apparatus, a system, a device or a method. Several inventive embodiments of the present invention are described below.

Briefly, a SDRAM system includes a SDRAM having multiple banks of memory, a plurality of bank state machines associated the multiple banks of memory of the SDRAM, and a data control state machine. The data state machine is responsive to a memory request for a variable length data transfer with the SDRAM and as well as the bank state machines. The data control state machine determines the current state of a first bank of memory of the SDRAM. The current state may be either a read in progress, a write in progress, or idle. The data control state machine then handles the memory request with a different bank of memory RAM depending upon the current state of the first bank of memory.

In another embodiment of the present invention, a method for processing variable length data transfers in a SDRAM is disclosed. The method includes receiving a memory request for a variable length data transfer with a SDRAM having multiple banks of memory. A current state of a currently used bank of memory of the SDRAM is selected from the states of read in progress, write in progress, and idle. The memory request to a selected bank of memory is chosen and handled depending upon the current state of the SDRAM.

An advantage of the present invention is that it provides for efficient use of the memory banks of a SDRAM for multiple variable length memory requests. More specifically, the present invention allows the processing of multiple variable length memory requests by determining when each memory bank access will terminate. The present invention then maximizes use and reduces idle time of the SDRAM memory banks by identifying a window of opportunity at which it is possible to overlap a second transaction with the current transaction and processing the second transaction before the current transaction terminates.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following, detailed description in conjunction with the accompanying drawings. To facilitate this description, like reference numerals designate like structural elements.

DETAILED DESCRIPTION OF THE PREFERRED EMBODIMENTS

In the following description, numerous specific details are set forth in order to provide a thorough understanding of the present invention. It will be understood, however, to one skilled in the art, that the present invention may be practiced without some or all of these specific details. In other instances, well known structures and process operations have not been described in detail in order not to unnecessarily obscure the present invention.

Figure 1:
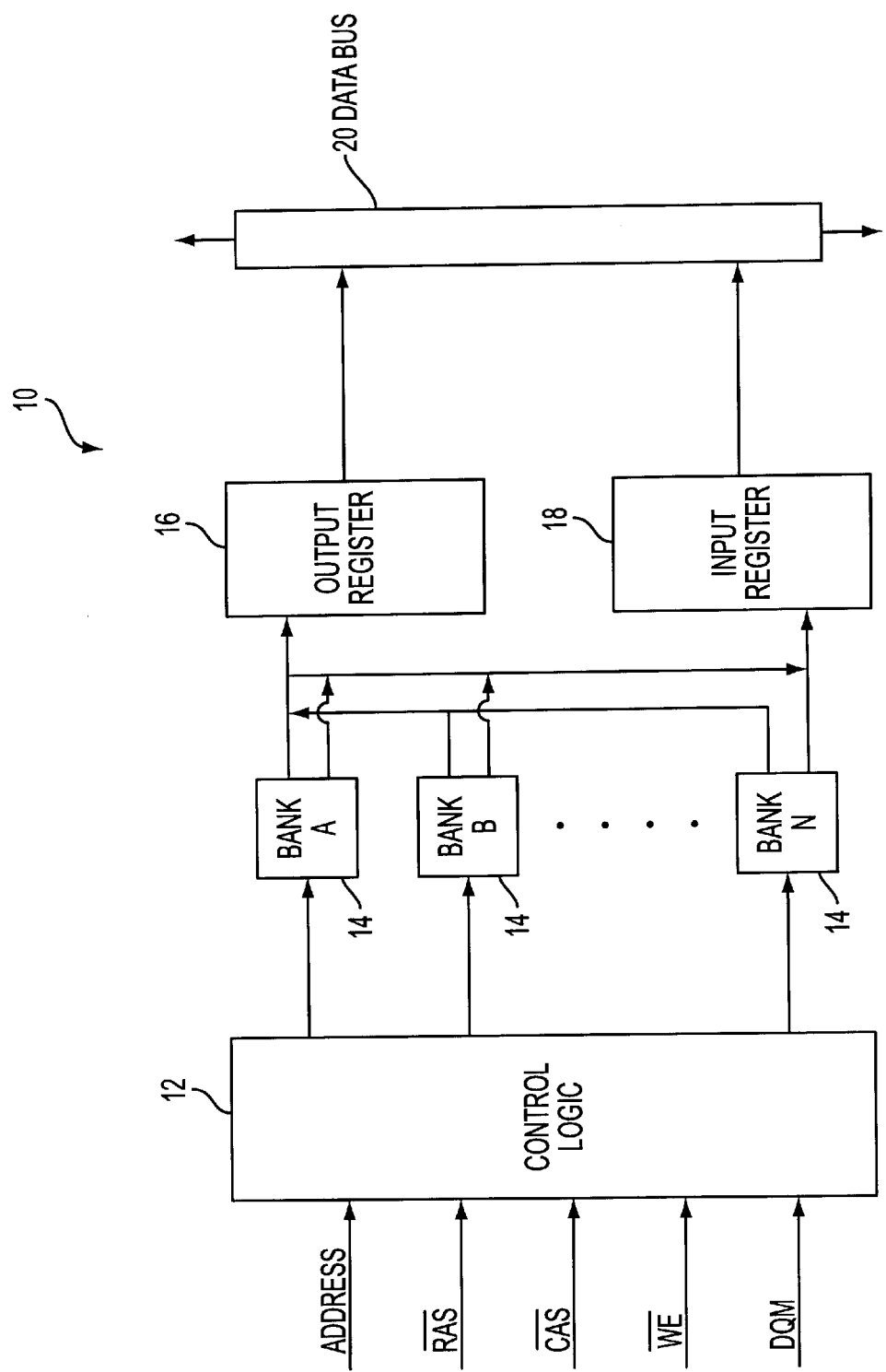
FIG. 1 is a block diagram illustrating a SDRAM controller.
Figure 2A:
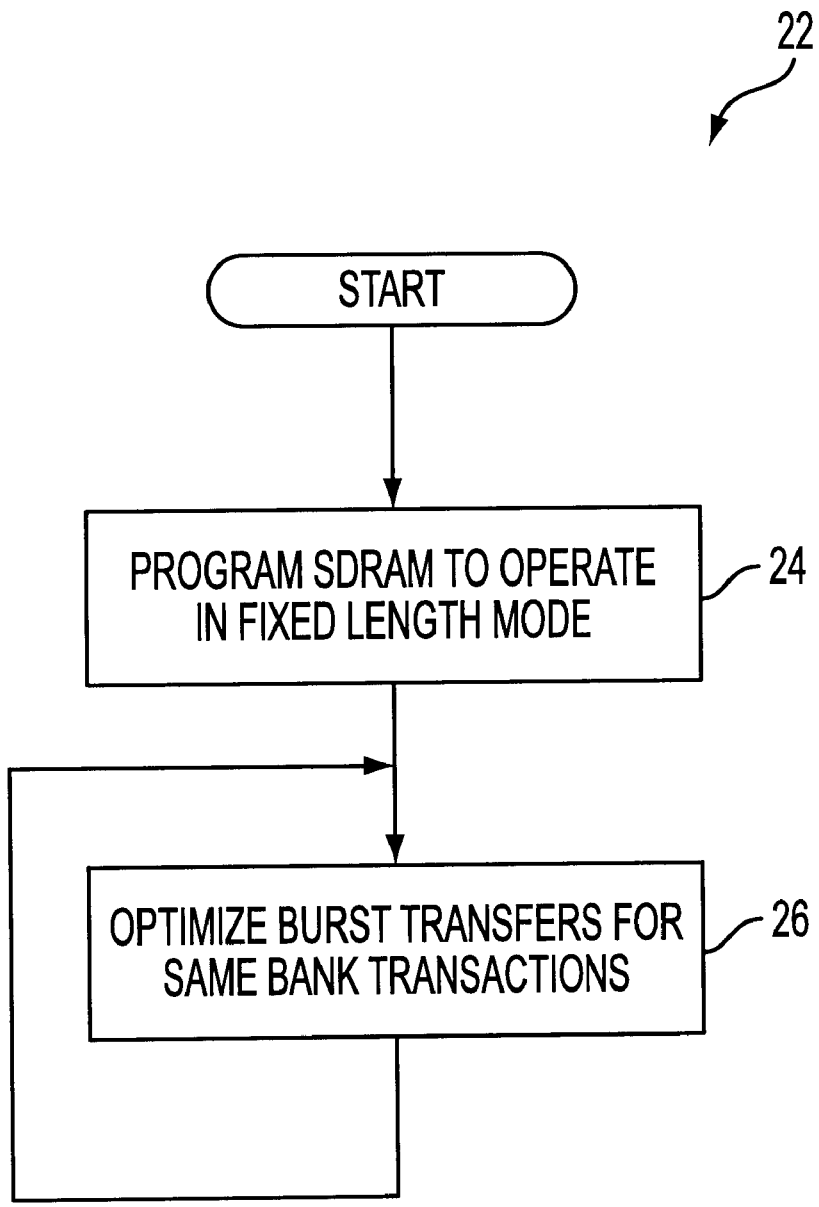
FIG. 2A is a flow chart of a prior art method of operating a SDRAM controller in the fixed length mode.
Figure 2B:
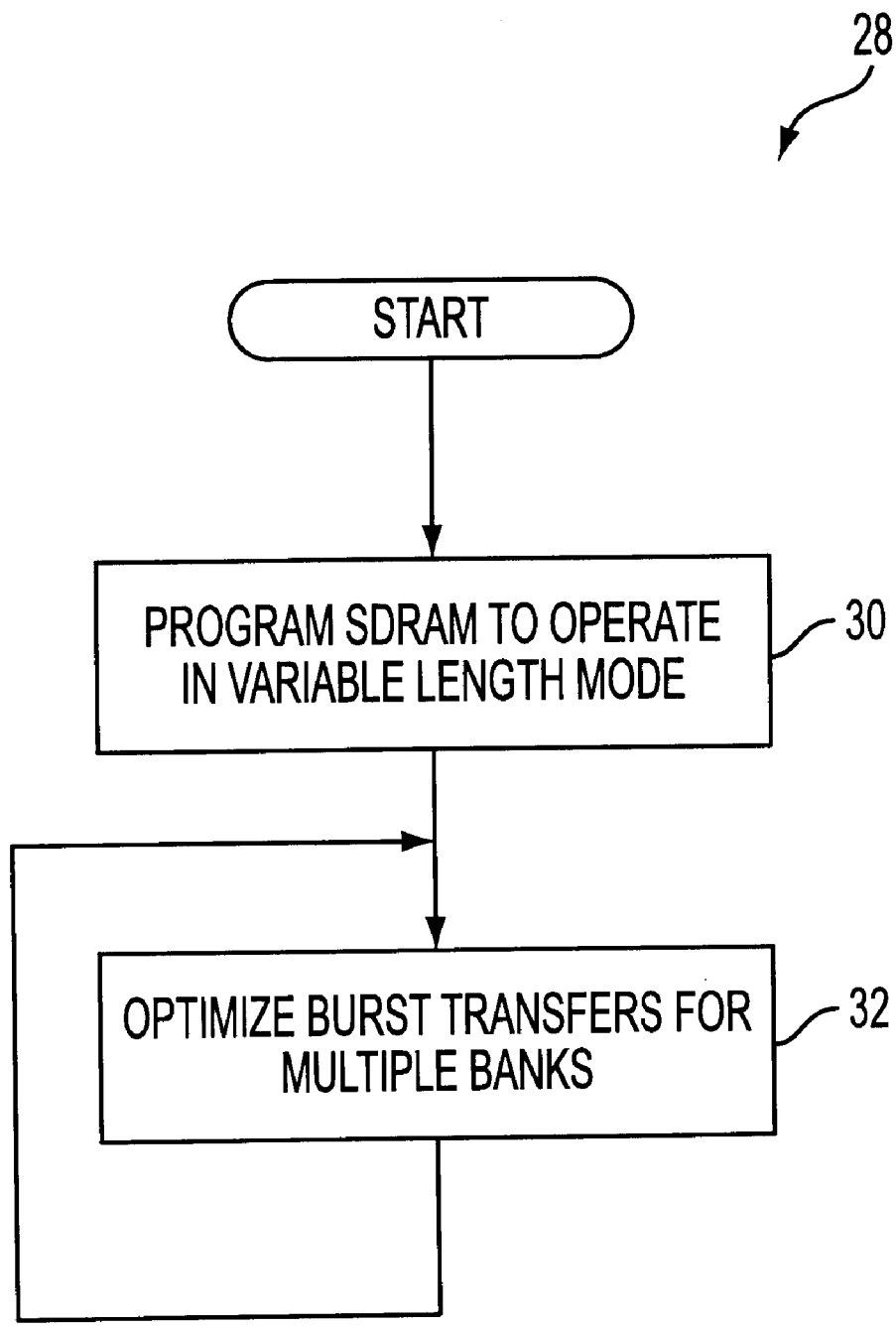
FIG. 2B is a flow chart of a prior art method of operating a SDRAM controller in a variable length mode.
Figure 2C:
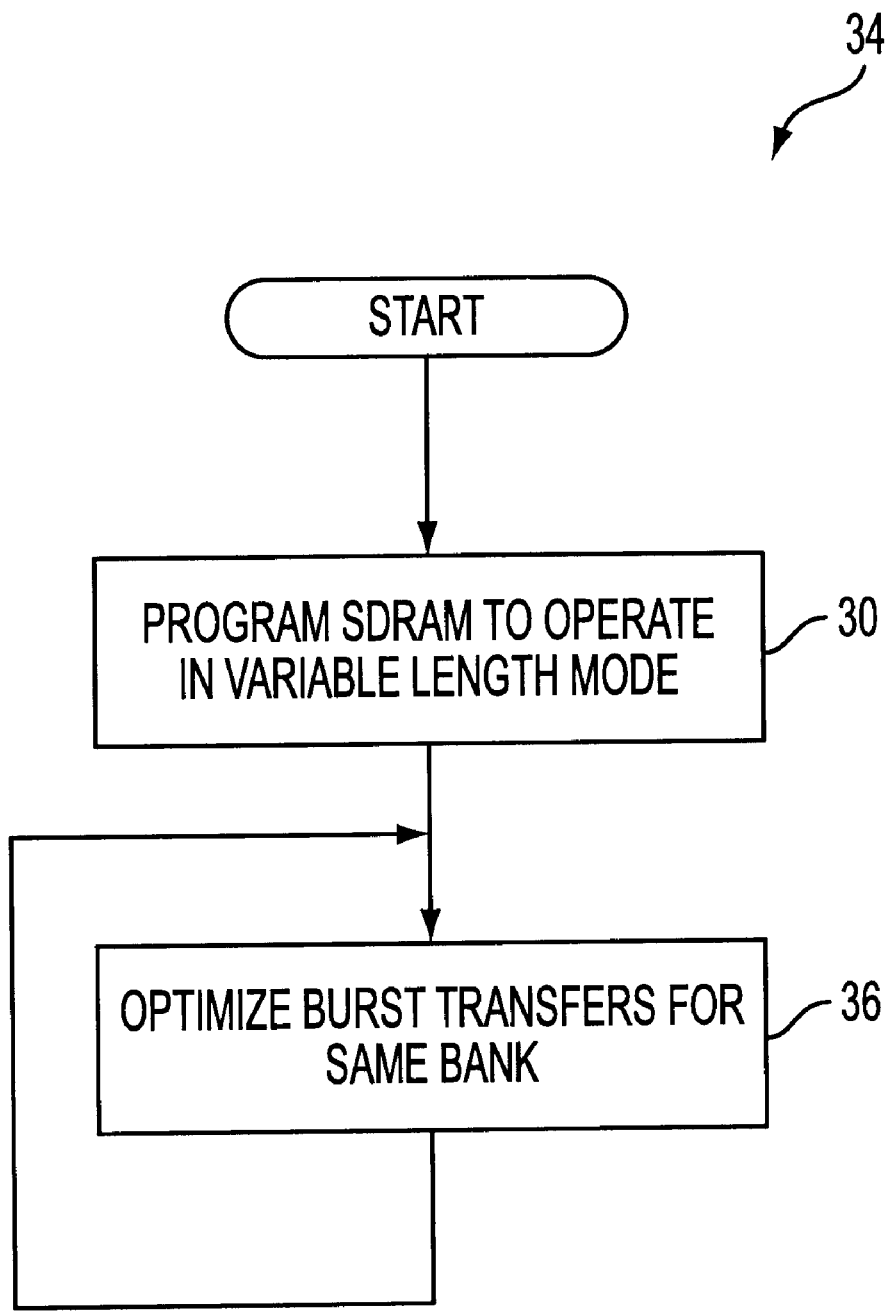
FIG. 2C is a flow chart of a alternative prior art method of operating a SDRAM controller in variable length mode.
Figure 3:
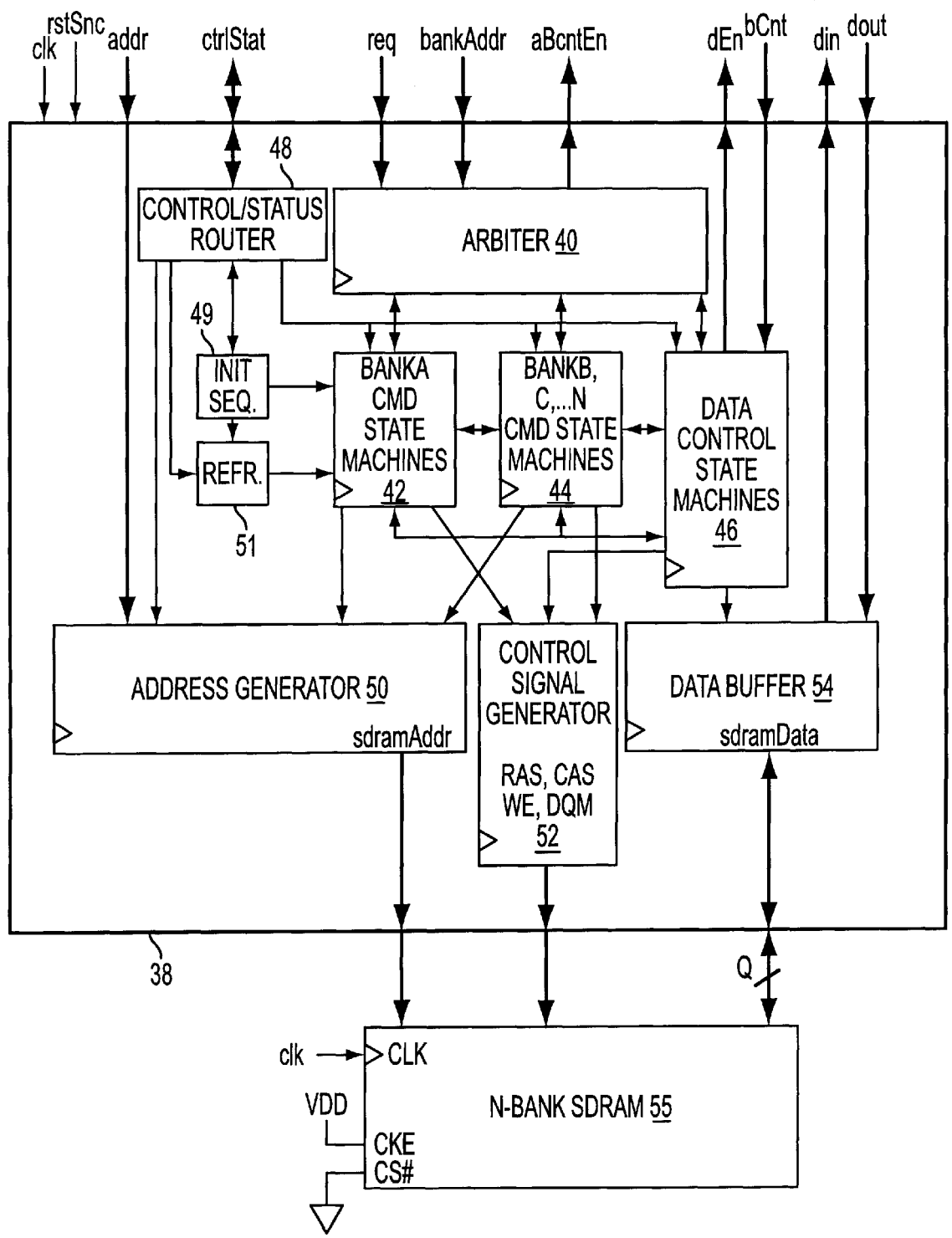
FIG. 3 illustrates a SDRAM controller in accordance with one embodiment of the present invention and an associated N-Bank SDRAM.

FIGS. 1 and 2A–2C were described with reference to the prior art. FIG. 3 illustrates a SDRAM controller 38 in accordance with one embodiment of the present invention. SDRAM controller 38 includes an arbiter 40, a BankA state machine ("master state machine") 42, a number of BankB . . . BankN state machines ("common state machines") 44, a data control state machine 46, a control/status router module 48, an initialization sequencer 49, an address generator 50, a refresh module 51, a control signal generator 52, and a data buffer module 54.

SDRAM controller 38 communicates with N-Bank SDRAM 55, which stores and retrieves data for an infinite number of banks for use by SDRAM controller 38 and the devices to which SDRAM controller 38 is attached. Arbiter 40 receives inputs from the external req and bankAddr busses, from master state machine 42, common state machines 44, and data control state machines 46. Using the input information, arbiter 40 then arbitrates between the requestors, and after establishing the priority of requestors for access to N-Bank SDRAM 55, outputs to the external aBcntEn bus, master state machine 42, common state machines 44, and data control state machines 46.

Master state machine 42 and common state machines 44 receive input from control/status router module 48, initialization sequencer 49, refresh module 51, and data control state machines 46 in addition to being in communication with arbiter 40 and each other. Master state machine 42 and common state machines 44 are associated with the corresponding memory banks in N-Bank SDRAM 55 and function to provide the appropriate sequence of signal change timing indicators to manage the access to the corresponding memory banks in N-Bank SDRAM 55.

Data control state machines 46 receive inputs from the external bCnt bus, control/status router module 48, the arbiter 40, master state machine 42, and common state machines 44, and produces outputs to the external dEn bus, arbiter 40, master state machine 42, common state machines 44, control signal generator 52, and data buffer module 54. Data control state machines 46 provide the appropriate sequence of signal change timing indicators to manage the flow of data between N-Bank SDRAM 55 and the external din and dout busses.

Control/status router 48 modifies the functionality of SDRAM controller 38 based on control/status programming values. Initialization sequencer 49 restrains refresh module 51, directs master state machine 42 to produce an initialization sequence to N-Bank SDRAM 55, and reports to control/status router 48 when initialization is complete. Address generator 50 receives input from the external addr bus, control/status router 48, and state machines 42 and 44 to send the appropriate address to N-Bank SDRAM 55. Data buffer 54 temporarily stores data that is being transferred between N-Bank SDRAM 55 and the external din and dout busses.

Figure 4:
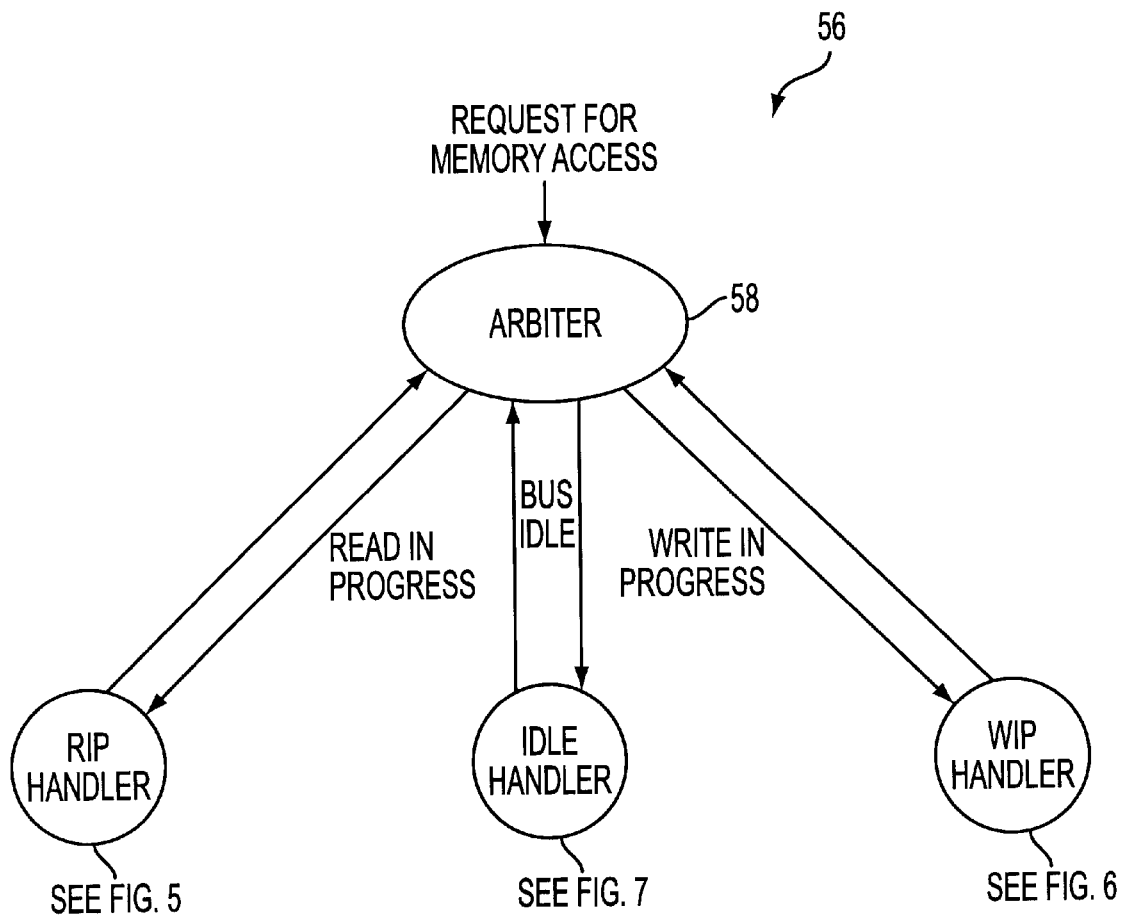
FIG. 4 illustrates a method of processing requests for memory access in accordance with one embodiment of the present invention.

FIG. 4 is a flow chart of a method 56 of processing requests for memory access in accordance with an embodiment of the present invention. Method 56 begins when the request for memory access is received by the arbiter in an operation 58. The arbiter then determines whether there is a read in progress (RIP), a write in progress (WIP), or if the data bus is idle. After the arbiter determines the current state of the data bus, it then directs method 56 to the corresponding handler, either the RIP handler, the WIP handler, or the idle handler. The methods of each handler, all of which are optimized for maximum efficiency (the least amount of idle time) are described below.

Figure 5:
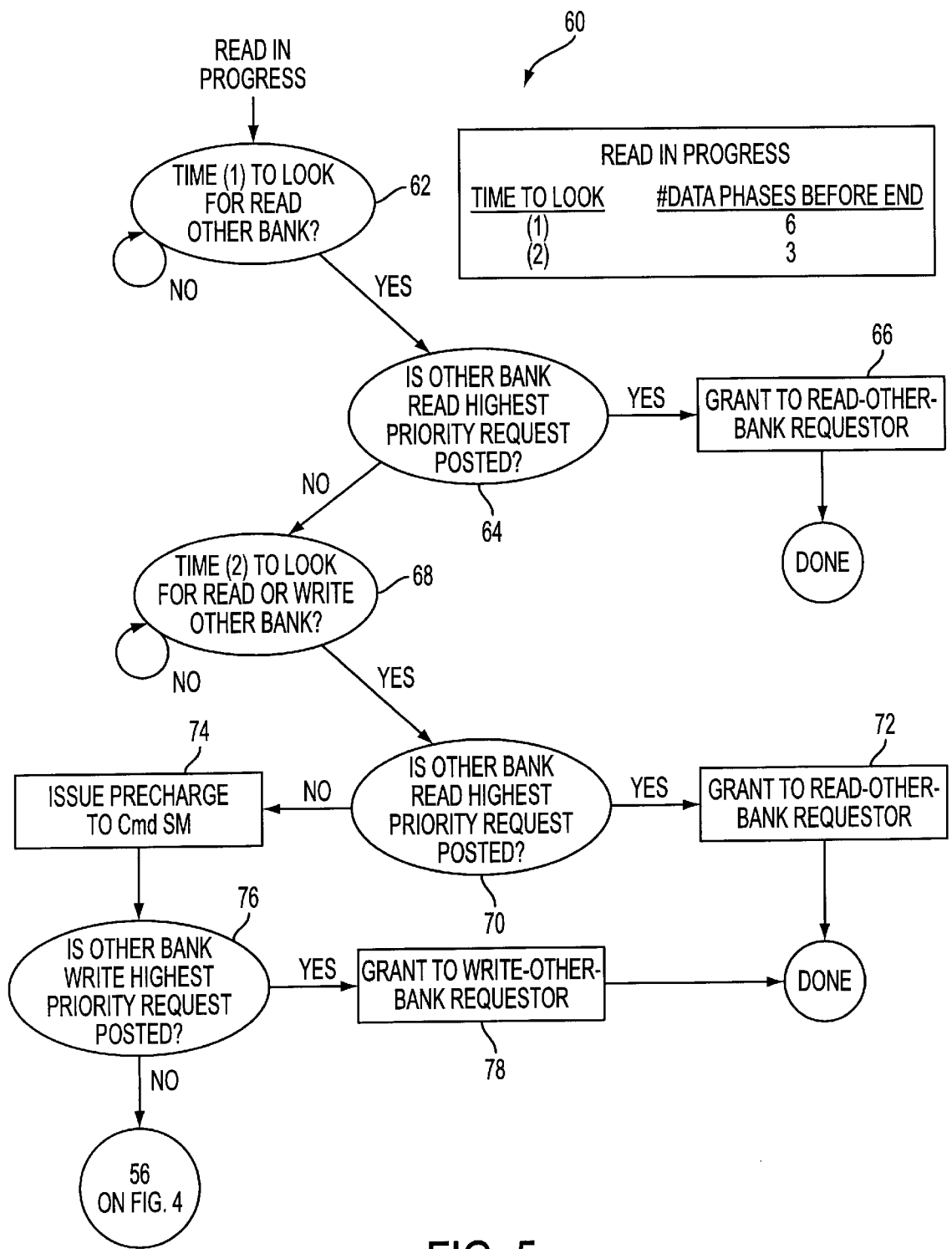
FIG. 5 is a flow chart of a method of processing a request for memory access when there is a read in progress on the data bus.

FIG. 5 is a flow chart of a method 60 of processing a request for memory access when there is a read in progress on the data bus. Method 60 begins with an operation 62, where the arbiter waits for Time (1), six phases before the end of the read in progress, to look for a read other bank to process during this first window of opportunity where the SDRAM can overlap transactions for maximum efficiency. At Time (1), an operation 64 determines whether there exists an other bank read request that has the highest priority of all the requests posted. If so, an operation grants memory access to the other bank read requestor to start a new address in an operation 66, and then ends method 60.

The read other bank request is granted first because it can be accomplished with no idle cycles between transactions when there is a read in progress. If there is no other bank read request or there is but it does not have the highest priority of the requests posted, then the arbiter waits until it is Time (2), three data phases before the end of the read in progress, to look for a read or other bank write, an operation 68. If it is Time (2), an operation 70 determines whether there exists an other bank read request that is the highest priority request posted. If so, then an operation 72 grants memory access to the other bank read requester to start a new address, and then ends method 60.

If not, an operation 74 issues a precharge to the command state machine to ensure that the SDRAM maintains its charge. The precharge also terminates the cycle, thereby eliminating an inefficient explicit termination cycle to the SDRAM. Method 60 then proceeds to an operation 76, which determines whether there exists an other bank write that is the highest priority request posted. If so, then an operation 78 grants memory access to the other bank write requester, and ends method 60. If not, method 60 then ends, and the process continues by returning to method 56 in FIG. 4.

Figure 6:
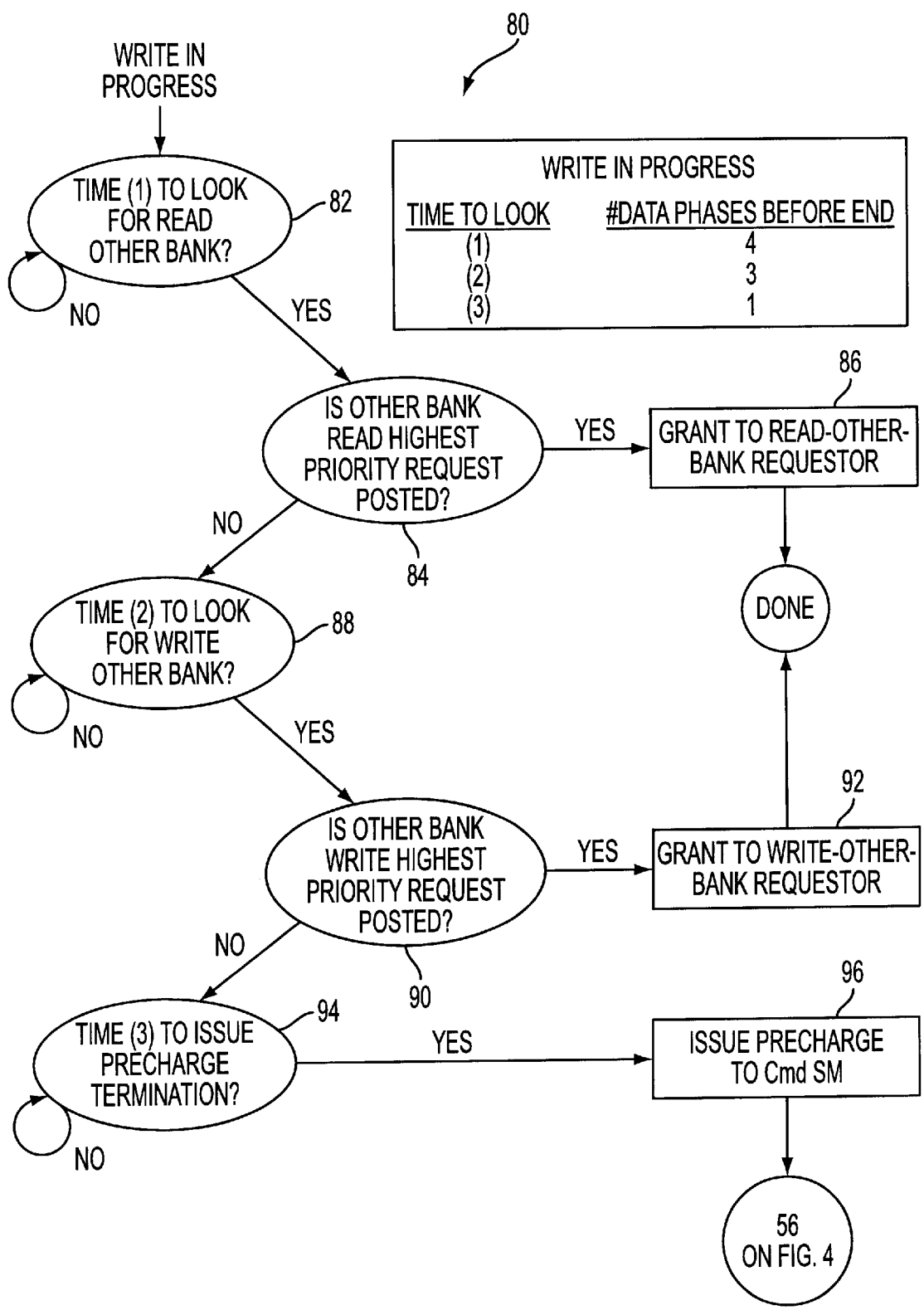
FIG. 6 is a flow chart of a method of processing a request for memory access when there is a write in progress on the data bus.

FIG. 6 is a flow chart of a method 80 of processing a request for memory access when there is a write in progress on the data bus. Method 80 begins with an operation 82 waiting for Time (1), four data phases before the end of the write in progress. At Time (1), an operation 84 determines whether an other bank read exists and is the highest priority request posted. If an other bank read is present and is request is the highest priority request posted, then memory access will be granted in an operation 86, ending method 80.

If a other bank read request is not the highest priority request posted, then an operation 88 waits until it is Time (2), three data phases before the end of the write in progress. Then, an operation 90 determines whether a write other bank is the highest priority request posted. If so, then memory access is granted to the write other bank requester in an operation 92, ending method 80. If not, an operation 94 waits until Time (3), one data phase before the end of the write in progress before issuing a precharge to the command state machine in an operation 96. Method 80 then ends, and the process continues by returning to method 56 in FIG. 4.

Figure 7:
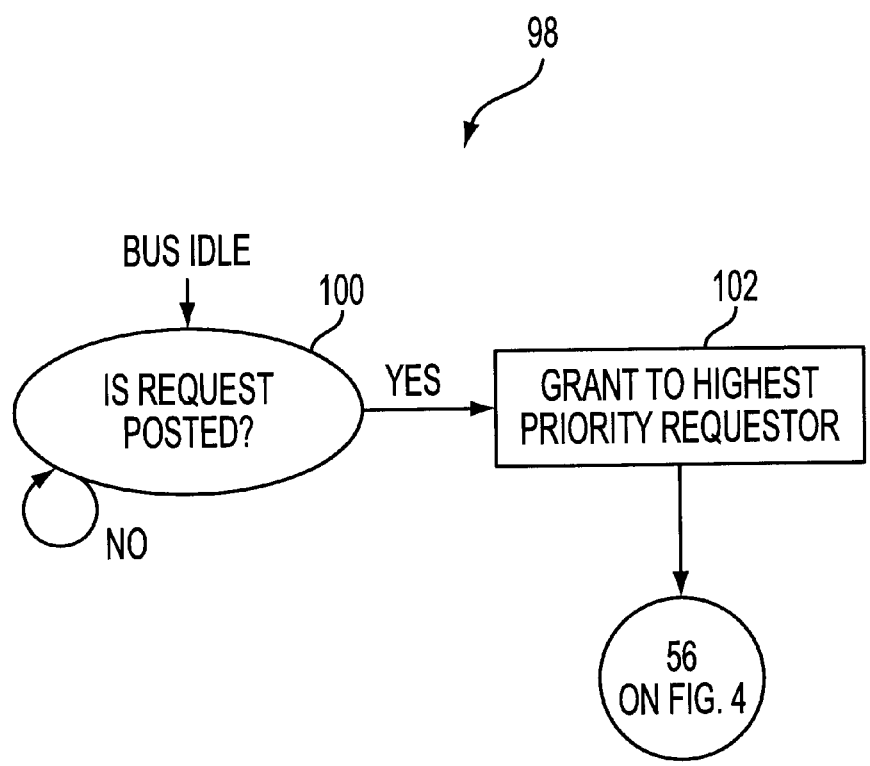
FIG. 7 is a flow chart of a method of processing a request for memory access when the data bus is idle.

FIG. 7 is a flow chart of a method 98 of processing a request for memory access when the data bus is idle. Method 98 begins at an operation 100 which determines whether a request is posted. If a request is posted, then memory access is granted to the highest priority requestor in an operation 102. Method 98 then ends, and the process continues by returning to method 56 in FIG. 4.

Figure 8:
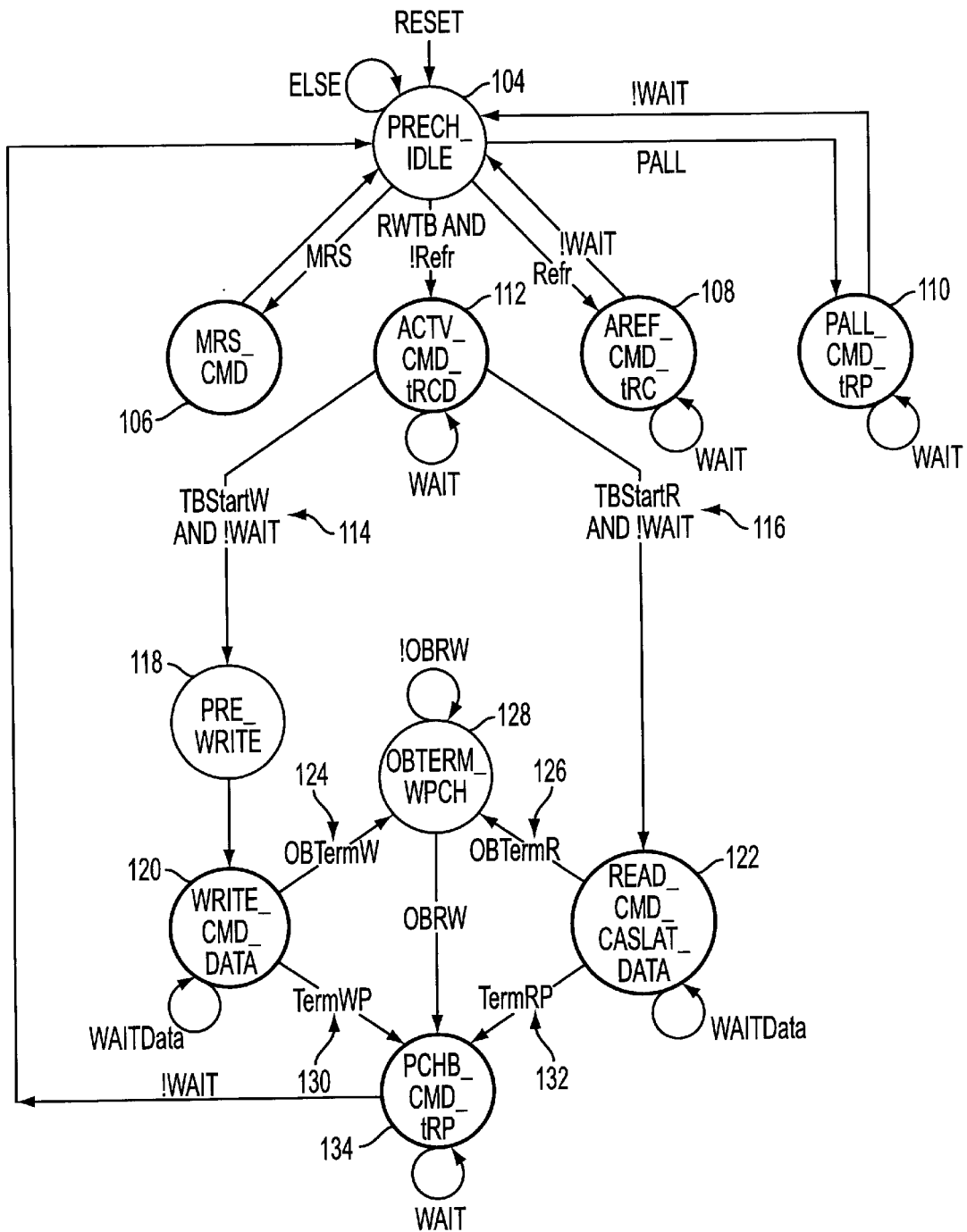
FIG. 8 is a state diagram of BankA state machine of FIG. 3.

FIG. 8 is a state diagram of BankA state machine 42 of FIG. 3. The BankA state machine is reset into the precharge idle state (PRECH_IDLE) 104, after which the state machine is initiated through control of the initiation sequencer with a mode register command (MRS_CMD) 106, a precharge all command (PALL_CMD_tRP) 110, and a series of auto refresh commands (ARES_CMD_tRC) 108, which apply to all the banks. After returning to the precharge idle state 104, an activate command (ACTV_CMD_tRCD) 112 is given to proceed to a write TBStartW 114 or a read TBStartR 116, waiting the proper time between activate and read/write.

From TBStartW 114, BankA state machine 42 enters a pre-write (PRE_WRITE) state 118 before proceeding to a write command (WRITE_CMD_DATA) state 120. From TBStartR 116, BankA state machine 42 proceeds to a read command (READ_CMD_CASLAT_DATA) state 122. From the write command state 120 and read command 122 state, if the state machine receives an other bank termination write (OBTermW) 124 or an other bank termination read (OBTermR) 126 that changes the state to an other bank termination waiting for precharge (OBTERM_WPCH) 128 state. If an optimized situation does not exist from write command 120 and read command 122, then a termination write with precharge (TermWP) 130 or a termination read with precharge (TermRP) 132 is executed. BankA state machine 42 then enters the precharge command (PCHB_CMD_tRP) state 134 before returning to precharge idle state 104.

Figure 9:
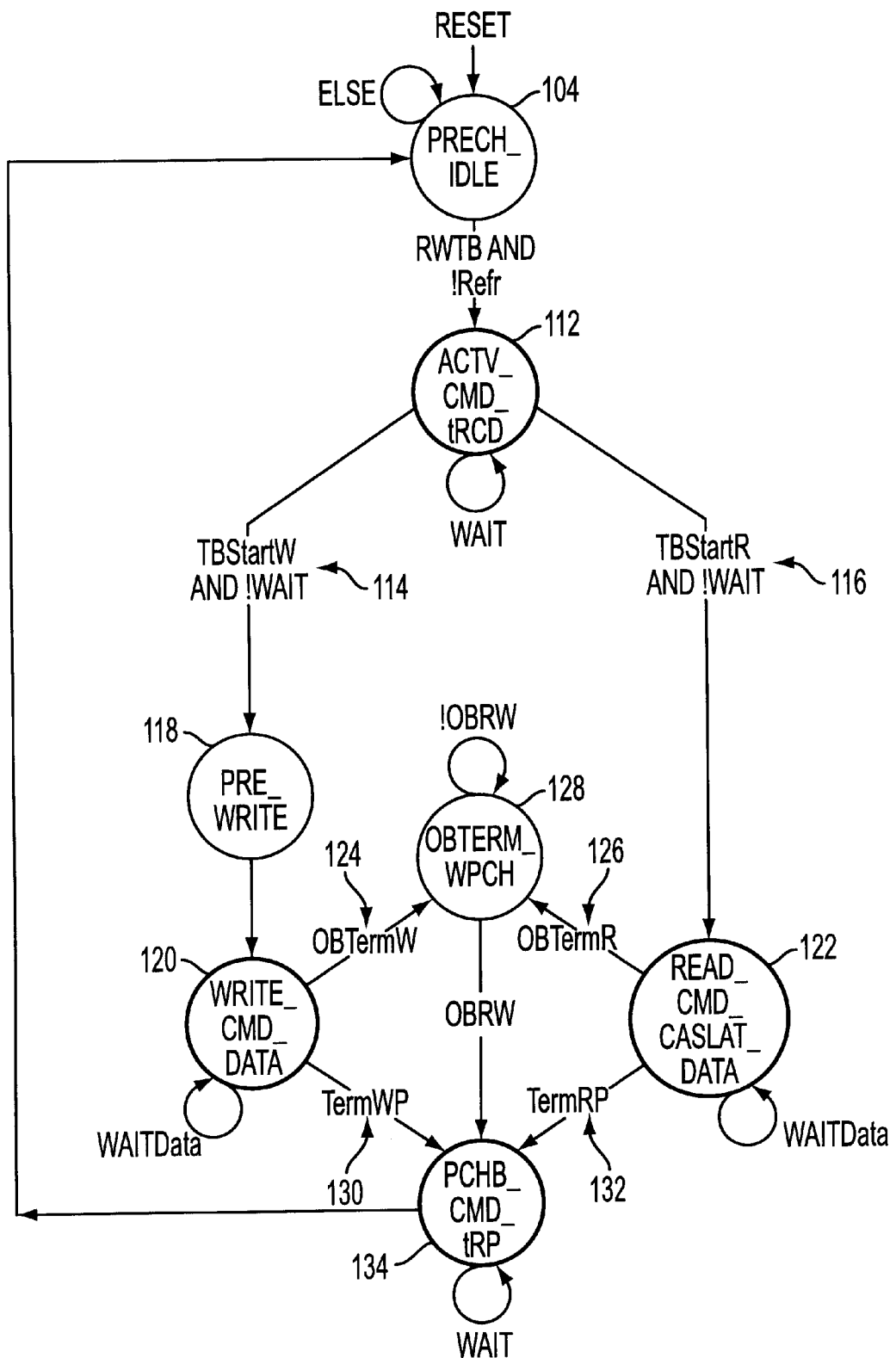
FIG. 9 is a state diagram of BankB-N state machine of FIG. 3.

FIG. 9 is a state diagram of BankB–N state machines 44 of FIG. 3. BankB-N state machines 44 are identical to BankA state machine 42, except it does not include mode register command 106, auto refresh command 108, or precharge all command 110.

Figure 10:
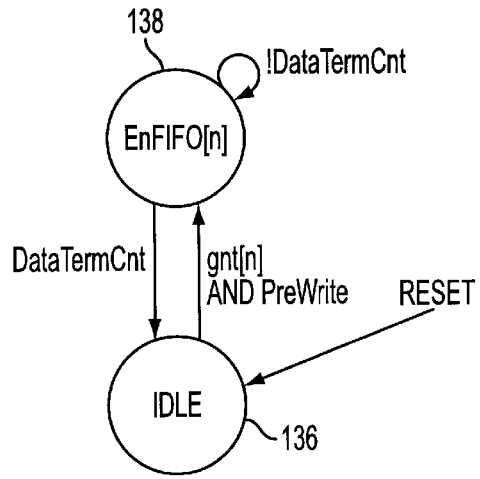
FIG. 10 is a state diagram of data control state machines of FIG. 3 after receiving a write command.

FIG. 10 is a state diagram of data control state machines 46 of FIG. 3 after receiving a write command. Data control state machines 46 keep track of the data phase to find out when the window of opportunity is for overlapping transactions. When there is a grant (gnt[n]), and the pre-write state of the BankA or BankB on state machine has been entered, data control state machines 46 exit idle state 136 and enable a write direction first in first out unit (EnFIFO[n]) 138. When a data terminal count occurs (DataTermCnt), the state returns to idle state 136. Therefore, the most efficient write would have at least 1 idle cycle in between write commands.

Figure 11:
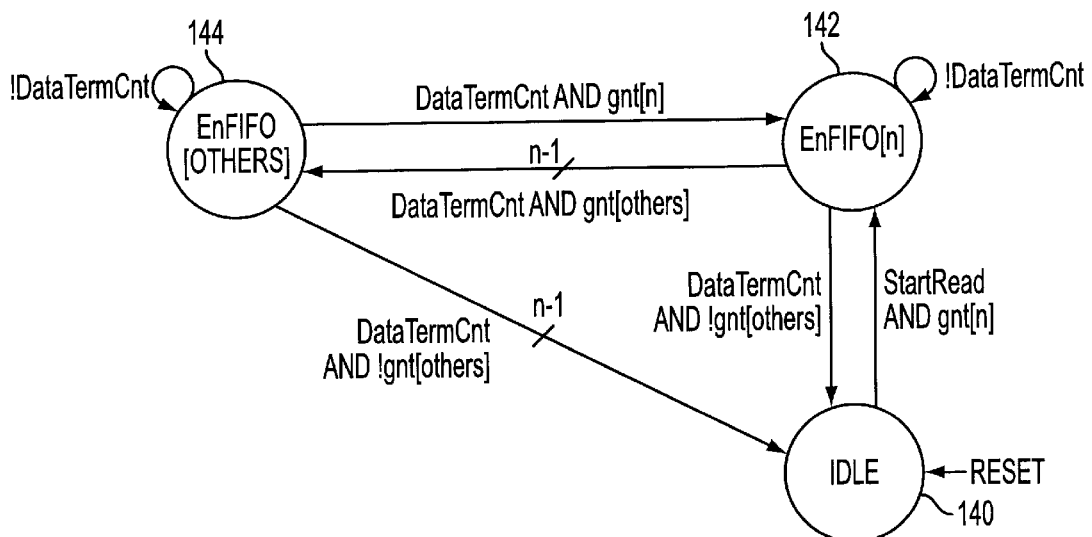
FIG. 11 is a state diagram of data control state machines of FIG. 3 after receiving a read command.

FIG. 11 is a state diagram of data control state machines 46 of FIG. 3 after receiving a read command. Starting from idle state 140, a start read (StartRead) command and grant are given, moving data control state machines 46 to enable a read direction the first in first out 142 until it receives a data terminal count. If there is a data terminal count and no grant, data control state machines 46 return to idle state 140. If however, there is a grant, then the transition is made to enable another read direction first in first out unit (EnFIFO [others]) 144 on the very next clock. The second read is therefore accomplished with zero idle cycles between the second read and the first read.

Figure 12:
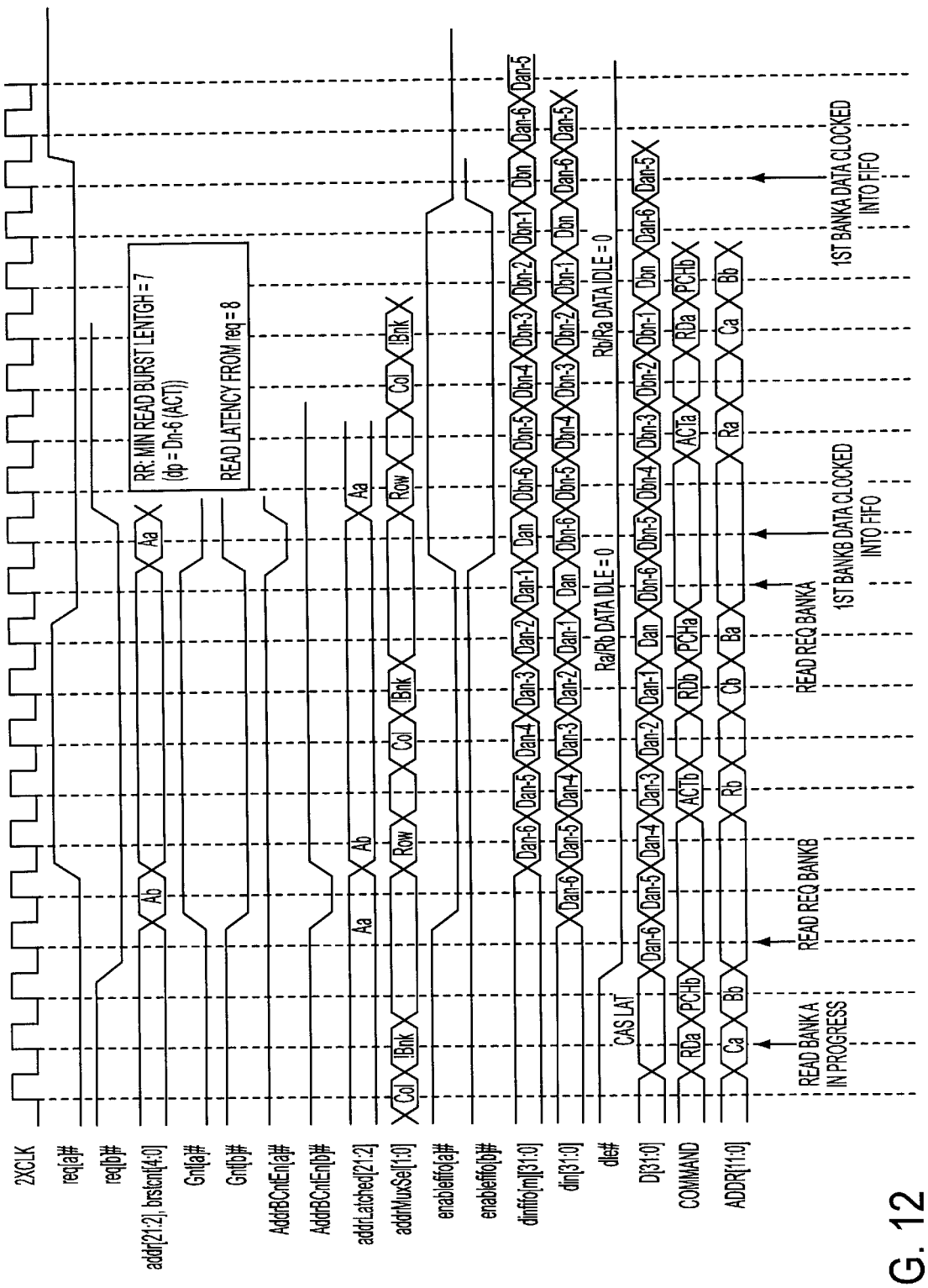
FIG. 12 is a timing diagram of the state machines during consecutive read commands with next transfer termination.

FIG. 12 is a timing diagram of the state machines during consecutive read commands with next transfer termination. The diagram shows the commands read BankA (RDa), precharge BankB (PCHb), and activate BankB (ACTb) followed by read BankB (RDb), precharge BankA (PCHa), and activate BankA (ACTa), etc. This is the most optimized transaction because the opposite bank is perfectly utilized following the flow diagram shown in FIG. 11. The timing diagram shows that the original bank and the opposite bank alternate three times in a row for the read command, and that the idle penalty is zero because there is no break in data bus usage (D[31:0]).

Figure 13:
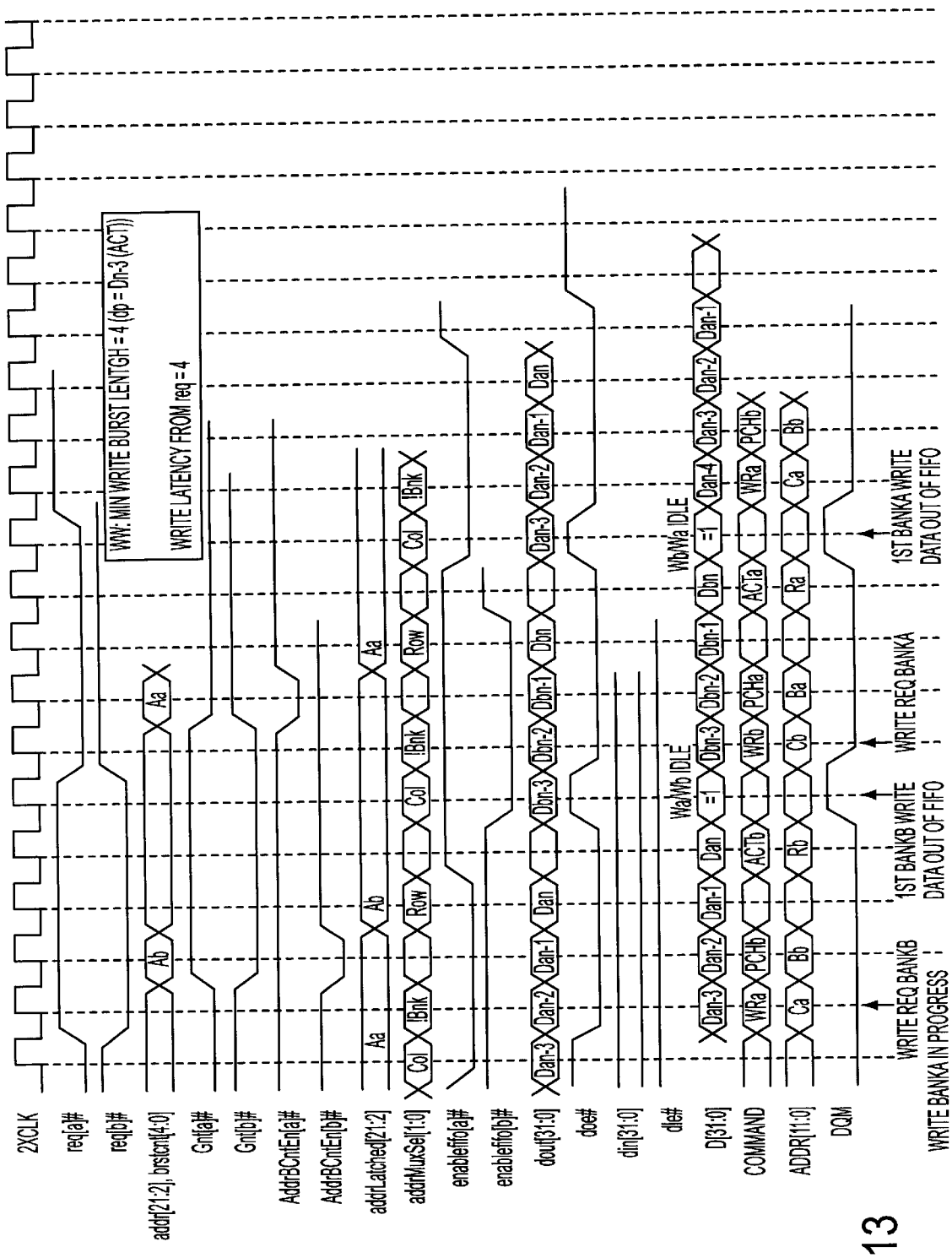
FIG. 13 is a timing diagram of the state machines during consecutive write commands with next transfer termination.

FIG. 13 is a timing diagram of the state machines during consecutive write commands with next transfer termination. The diagram shows the commands write BankA (WRa), precharge BankB (PCHb), and activate BankB (ACTb) followed by write BankB (WRb), precharge BankA (PCHa), and activate BankA (ACTa), etc. The opposite bank is utilized following the flow diagram shown in FIG. 10. The timing diagram shows that the original bank and the opposite bank alternate three times in a row for the write command, and that the idle penalty is one for each transaction boundary.

Figure 14:
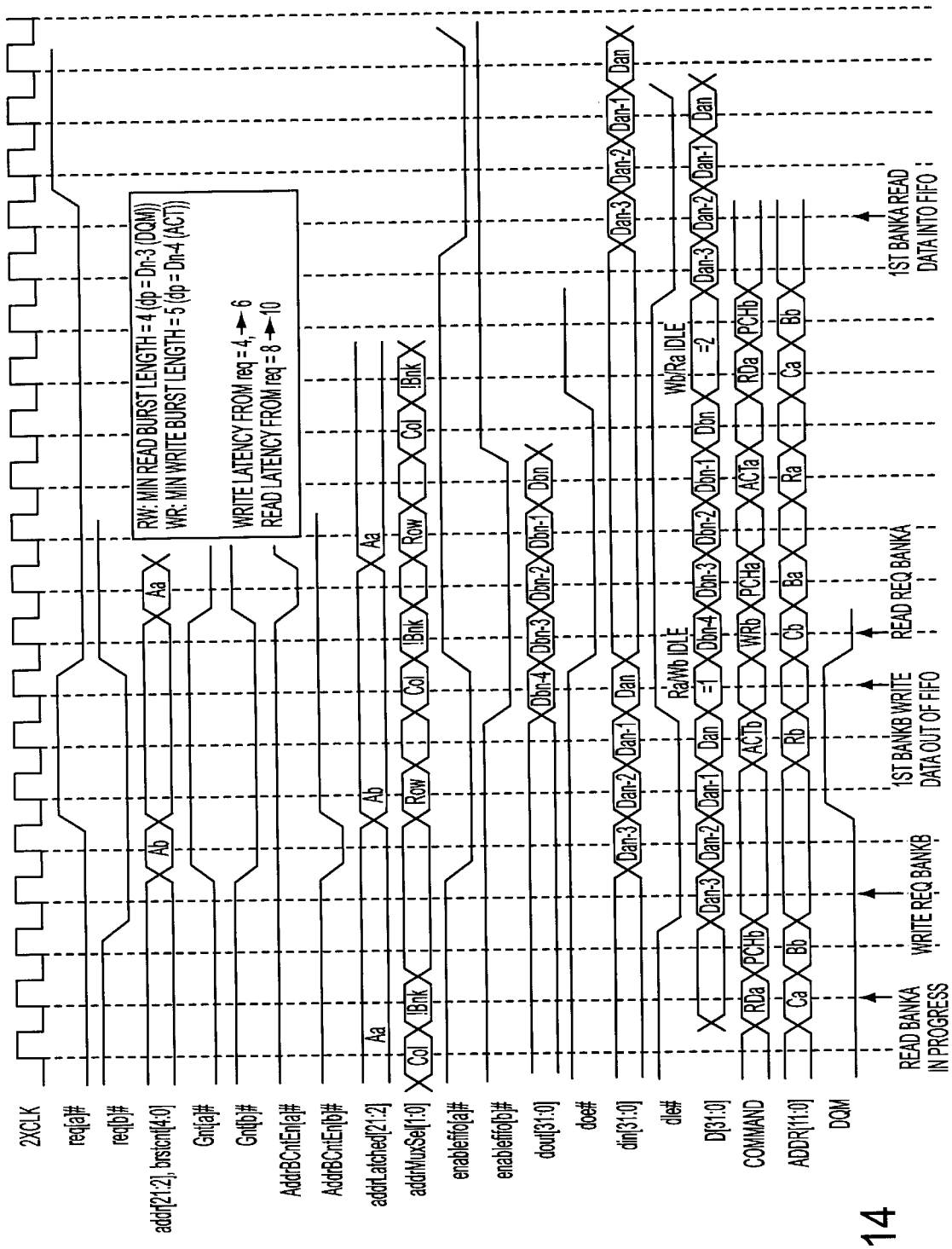
FIG. 14 is a timing diagram of the state machines during a read, a write and then another read command with next transfer termination.

FIG. 14 is a timing diagram of the state machines during a read, a write and then another read command with next transfer termination. The diagram shows the commands read BankA (RDa), precharge BankB (PCHb), and activate BankB (ACTb) followed by write BankB (WRb), precharge BankA (PCHa), and activate BankA (ACTa), etc. Again, there are opposite bank transactions, and there is one idle during the read, write opposite bank, and two idles during the read opposite bank (indicated by the second RDa).

Figure 15:
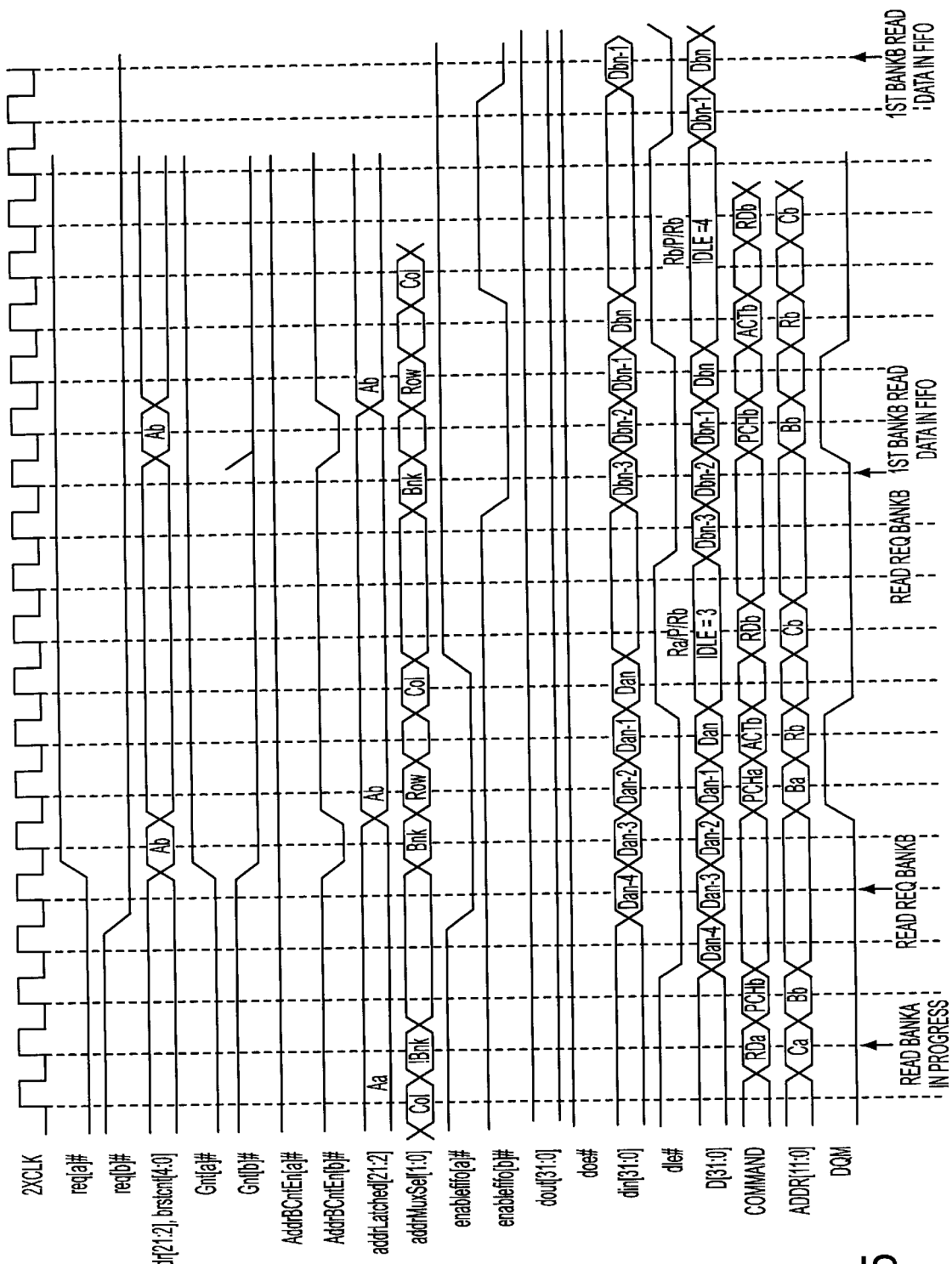
FIG. 15 is a timing diagram of the state machines during three reads with precharge termination.

FIG. 15 is a timing diagram of the state machines during three reads with precharge termination. The most important thing that the SDRAM does during variable length transactions is to terminate the existing transaction on time so that there is no overflow of data. As shown in FIG. 15, the window of opportunity for overlapping has passed making it impossible to terminate the existing transaction during the time that the next transaction is occurring. Therefore, a precharge termination is executed.

Figure 16:
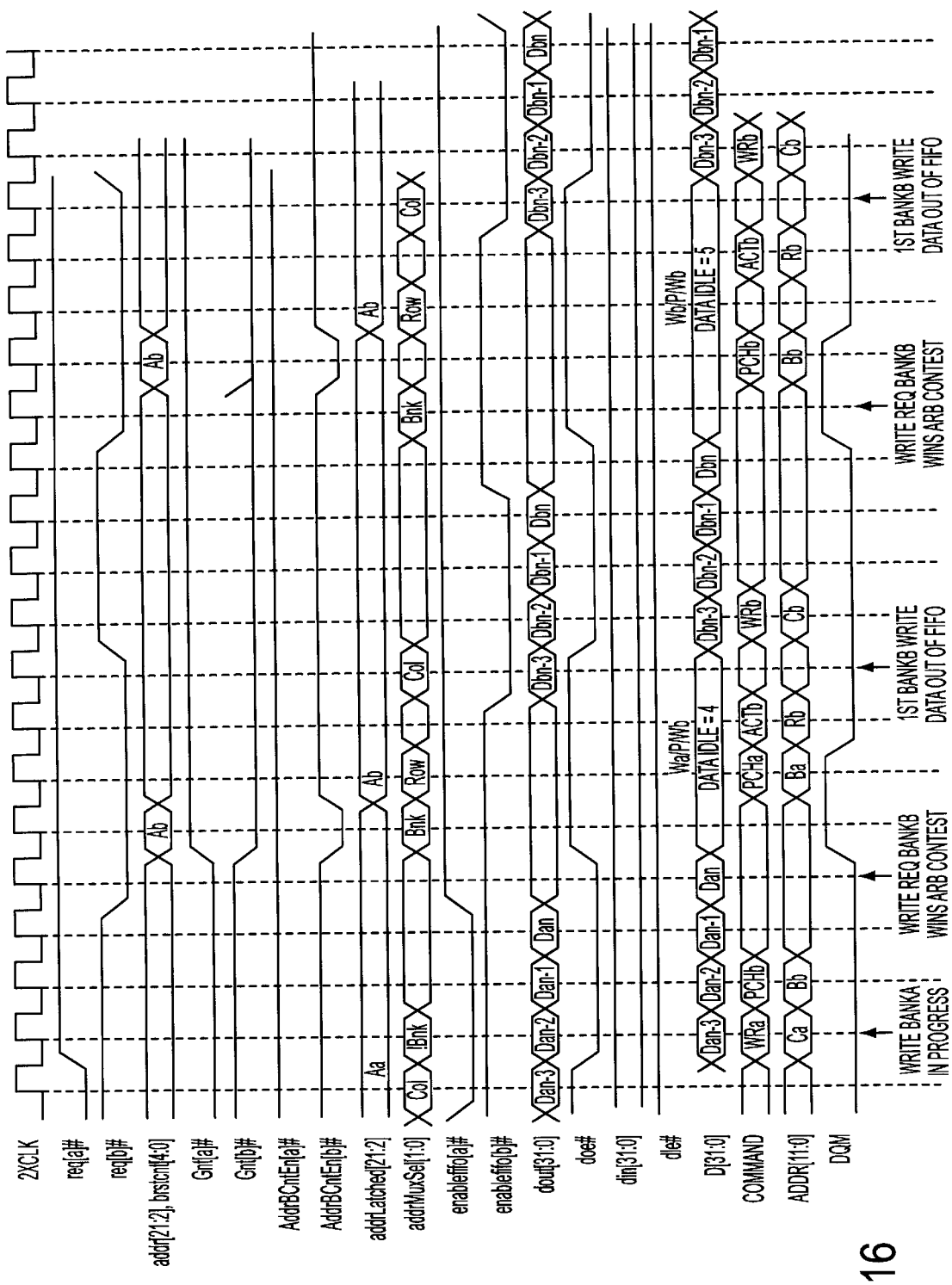
FIGS. 16–18 are timing diagrams of the state machines during various other operations with precharge termination.
Figure 17:
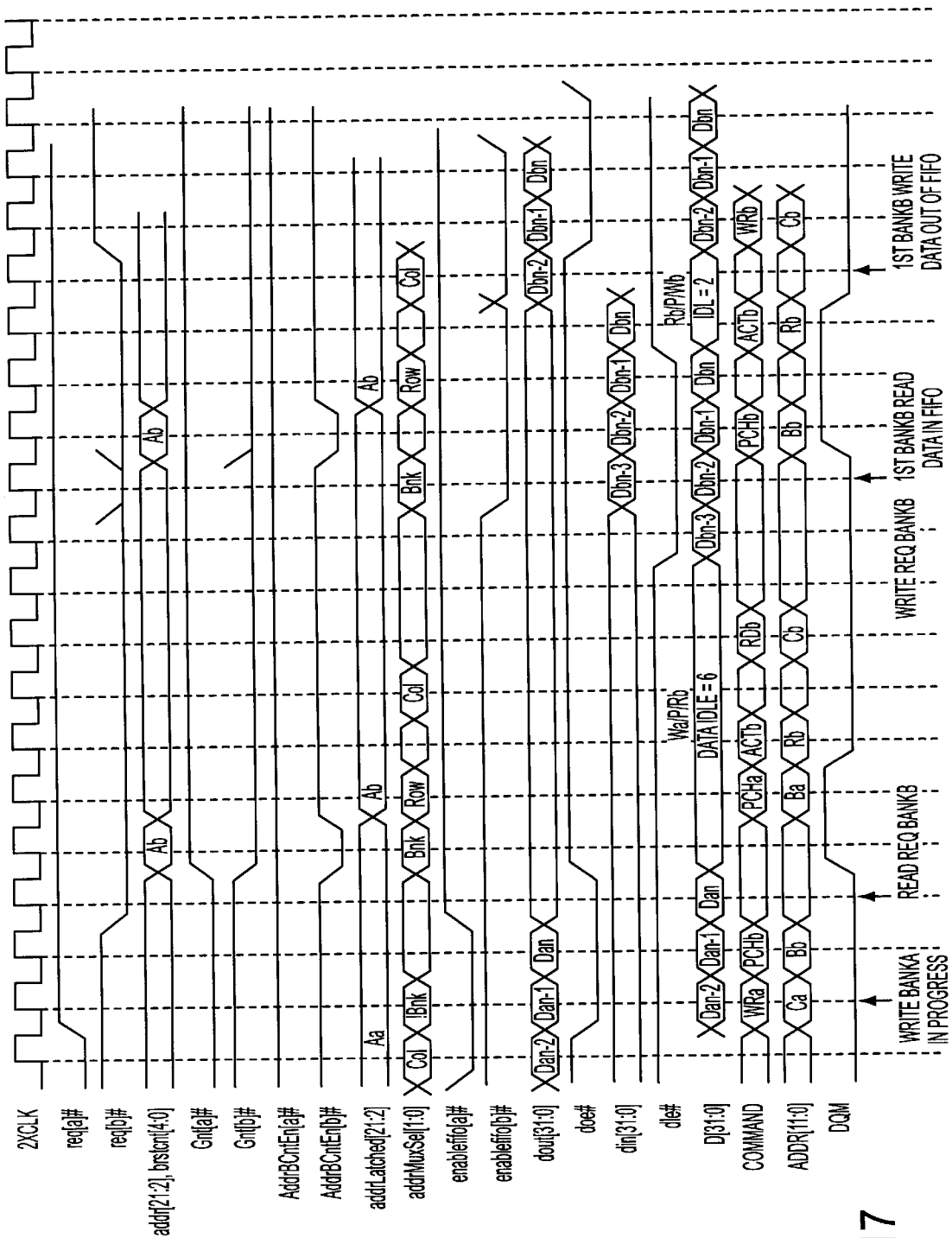
Figure 18:
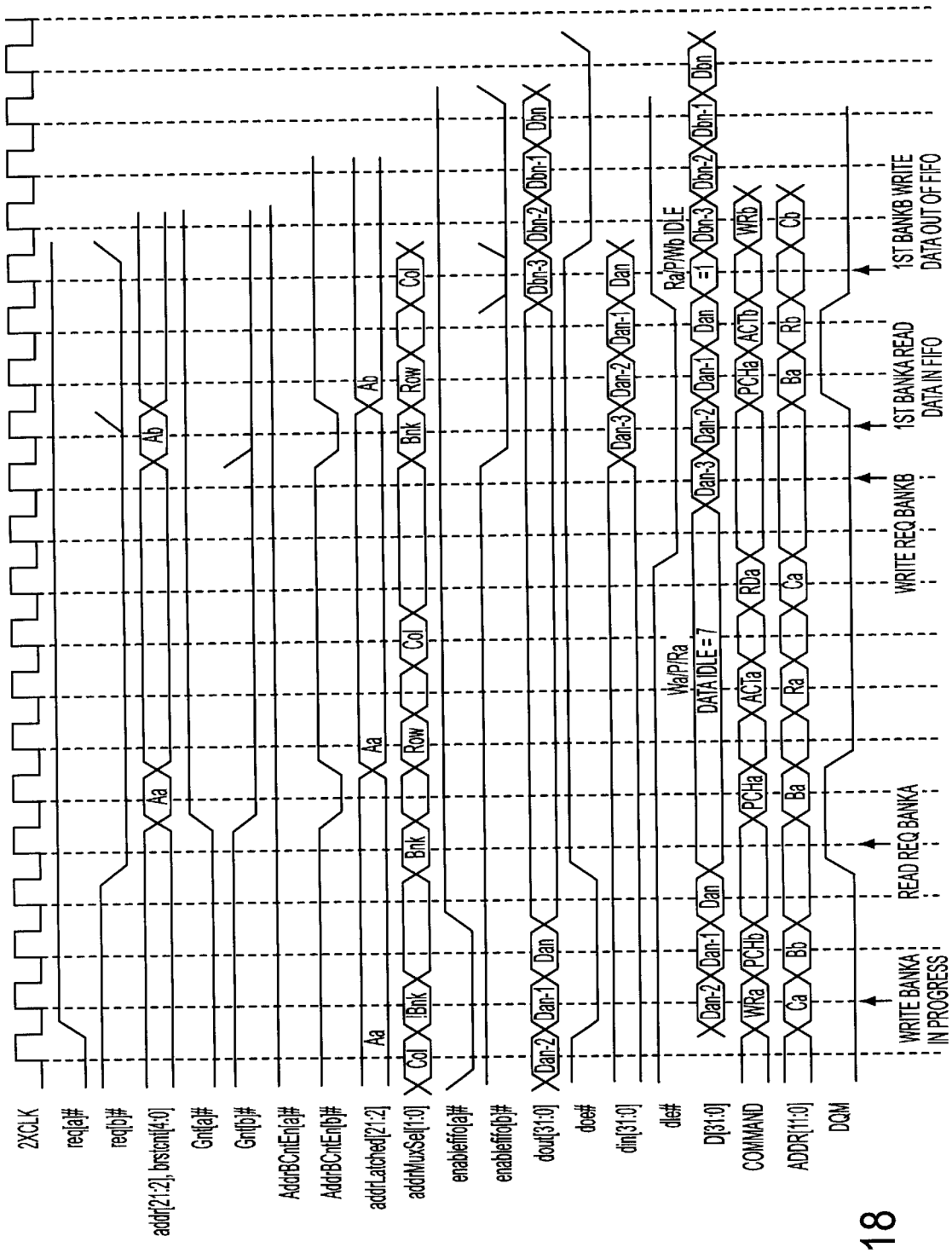

FIGS. 16–18 are timing diagrams of the state machines during various other operations with precharge termination. Again, in these cases, the window of opportunity to overlap transactions has lapsed resulting in several idle cycles. Therefore, a precharge termination is used as the last option to terminate the transaction on time.

Figure 19:
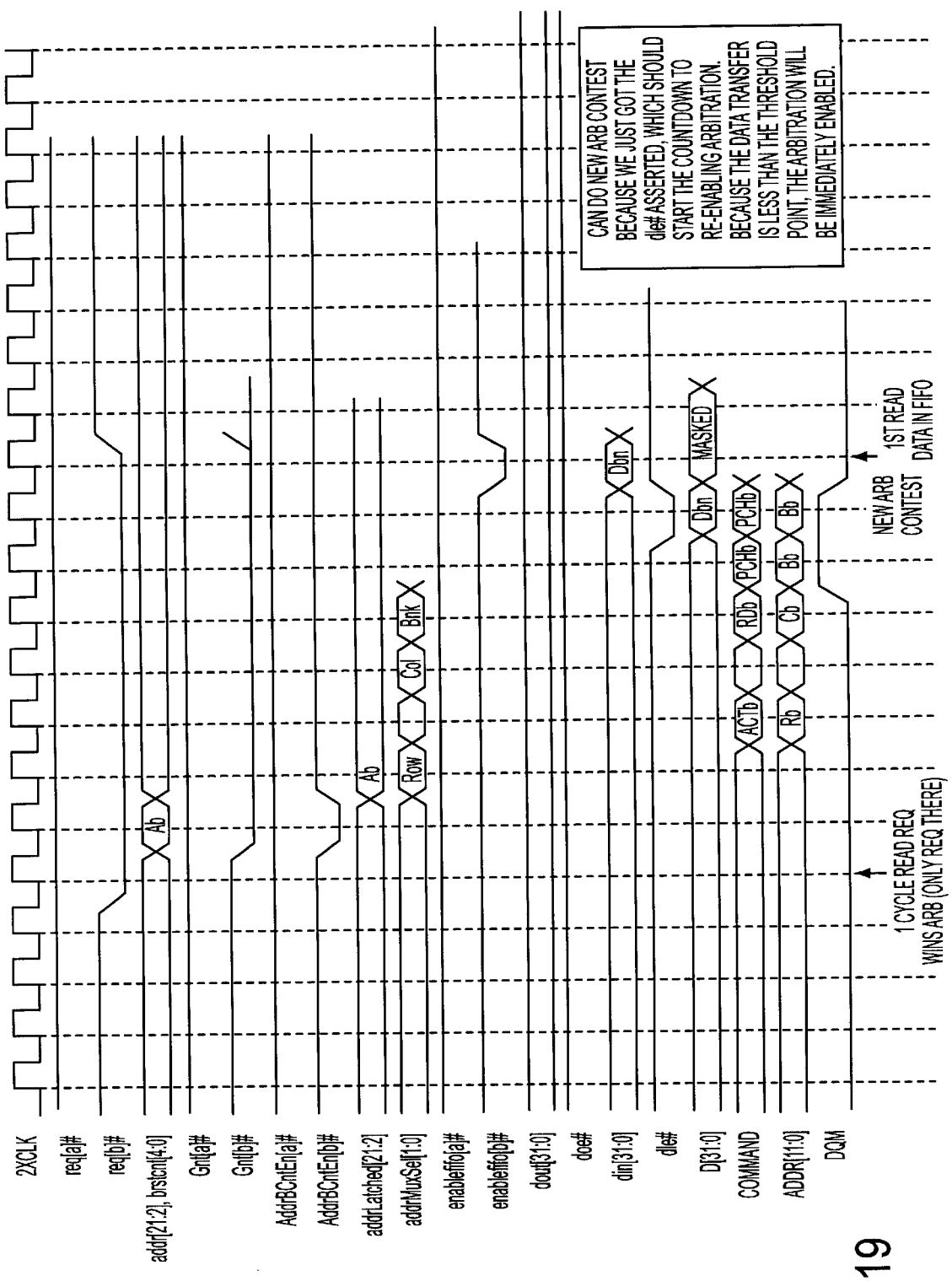
FIGS. 19–20 are timing diagrams for processor read and processor write transactions.
Figure 20:
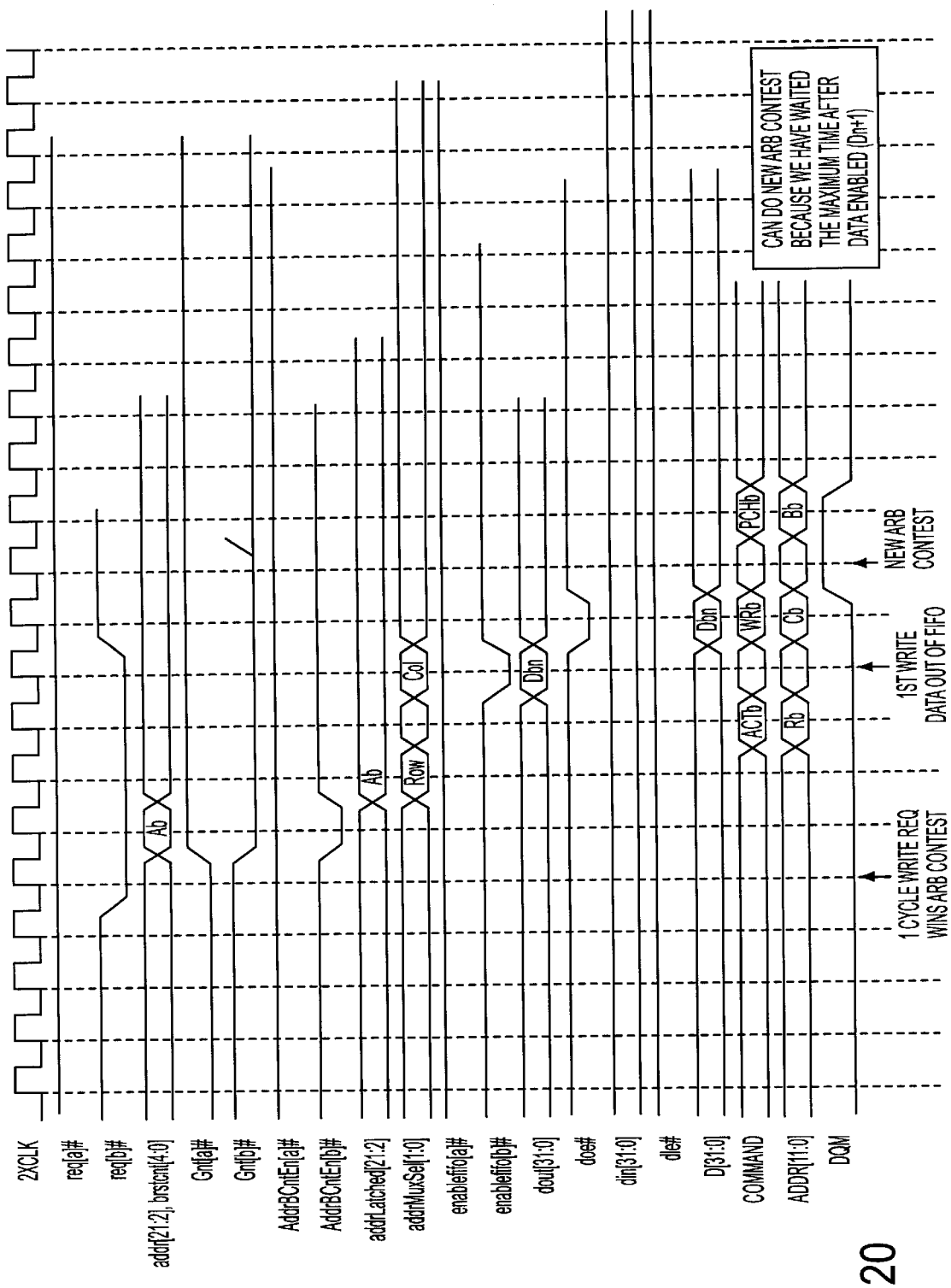

FIGS. 19–20 are timing diagrams for processor read and processor write transactions. These transactions are only one data phase long. To overlap transactions, a certain length of transaction is required. For example, in the processor read transaction represented by the timing diagram in FIG. 19, a length of greater than six clocks is required, otherwise there is not enough time to overlap transactions. Therefore, no overlap occurs when processor read or write transactions are serviced.

In summary, the present invention provides for efficient use of the memory banks of a SDRAM for multiple variable length memory requests. In particular, the present invention maximizes use and reduces idle of the SDRAM memory banks by identifying a window of opportunity at which it is possible to overlap a second transaction with the current transaction, and processing the second transaction before the current transaction terminates. For example, if the SDRAM is currently processing a read or write from the memory banks, and receives a new memory request, the SDRAM controller will determine a time at which there is a window of opportunity. If at such a time, the proper request is posted, then the SDRAM controller will grant memory access to the request to the opposite bank.

The invention has been described herein in terms of several preferred embodiments. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A SDRAM system comprising:
    a SDRAM having multiple banks of memory;
    a plurality of bank state machines associated, one each, with said multiple banks of memory of said SDRAM;
    a data control state machine responsive to a memory request for a variable length data transfer with said SDRAM and further being responsive to said plurality of bank state machines, said data control state machine determining the current state of a first bank of memory of said SDRAM selected from the states of read in progress, write in progress, and idle; and to handle said memory request with a different bank of memory RAM depending upon said current state of said first bank of memory.

2. A SDRAM system as recited in claim 1 further comprising an arbiter receiving multiple variable length data transfer requests from a plurality of requestors, wherein each of said plurality of requestors belongs to one of a plurality of classes of requestors, and arbitrating among said multiple SDRAM memory requests using heuristics dependent upon said classes of said requestors, creating a posted priority for each of said multiple SDRAM memory requests, and providing said memory request.

3. A SDRAM system as recited in claim 2 wherein said data state control machine is in communication with said plurality of bank state machines.

4. A SDRAM system as recited in claim 3 wherein said plurality of bank state machines includes a master state machine that generates an initialization sequence to said SDRAM in response to an initialization sequencer.

5. A SDRAM system as recited in claim 4 wherein said master state machine is in communication with said plurality of bank state machines.

6. A method for processing variable length data transfers in a SDRAM comprising:
    receiving a memory request for a variable length data transfer with a SDRAM having multiple banks of memory;
    determining the current state of a currently used bank of memory of said SDRAM selected from the states of read in progress, write in progress, and idle; and
    handling the memory request to a selected bank of said memory that is chosen depending upon said current state of said SDRAM.

7. A method for processing variable length data transfers in a SDRAM as recited in claim 6 further comprising:
    receiving multiple variable length data transfer requests from a plurality of requestors, wherein each of said plurality of requestors belongs to one of a plurality of classes of requestors; and
    arbitrating among said multiple SDRAM memory requests using heuristics dependent upon said classes of said requestors, creating a posted priority for each of said multiple SDRAM memory requests, and providing said memory request.

8. A method for processing variable length data transfers in a SDRAM as recited in claim 7 wherein when said current state is read in progress, said operation of handling said memory request includes:

waiting until said read in progress in a first bank is within a first number of data phases before its completion; and granting said memory request to a different bank if said memory request is a read of a highest posted priority.

9. A method for processing variable length data transfers in a SDRAM as recited in claim 8 further comprising:

waiting until said read in progress in said first bank is within a second number of data phases before its completion if said memory request is not a read of the highest posted priority; and granting said memory request to said different bank for one of a read memory request and a write memory request of said highest posted priority.

10. A method for processing variable length data transfers in a SDRAM as recited in claim 9 wherein said granting said memory request to said different bank for one of a read memory request and a write memory request includes:

granting a read memory request from said different bank if said read memory request is of said highest priority request posted.

11. A method for processing variable length data transfers in a SDRAM as recited in claim 10 wherein said granting said memory request to said different bank for one of a read memory request and a write memory request includes:

precharging a command state machine;

granting a write memory request from said different bank if said write memory request is of said highest priority request posted; and setting said current state to idle.

12. A method for processing variable length data transfers in a SDRAM as recited in claim 7 wherein when said current state is write in progress, said operation of handling said memory request includes:

waiting until said write in progress in a first bank is within a first number of data phases before its completion; and granting said memory request to a different bank if said memory request is a read of a highest posted priority.

13. A method for processing variable length data transfers in a SDRAM as recited in claim 12 further comprising:

waiting until said write in progress in said first bank is within a second number of data phases before its completion if said memory request is not a read of the highest posted priority; and granting said memory request to said different bank if said memory request is a write memory request of said highest posted priority.

14. A method for processing variable length data transfers in a SDRAM as recited in claim 13 further comprising:

waiting until said write in progress in said first bank is within a third number of data phases before its completion if said memory request is not a write of the highest posted priority; and precharging a command state machine; and setting said current state to idle.

15. A method for processing variable length data transfers in a SDRAM as recited in claim 7 wherein when said current state is idle, said operation of handling said memory request includes:

waiting until a memory request is posted; and granting said memory request to a different bank if said memory request is of a highest posted priority.

16. A method for processing variable length data transfers in a SDRAM comprising:

means for receiving a memory request for a variable length data transfer with a SDRAM having multiple banks of memory;

means for determining the current state of a currently used bank of memory of said SDRAM selected from the states of read in progress, write in progress, and idle; and means for handling the memory request with a selected bank of said memory that is chosen depending upon said current state of said SDRAM.

17. A method for processing variable length data transfers in a SDRAM as recited in claim 16 further comprising:

means for receiving multiple variable length data transfer requests from a plurality of requestors, wherein each of said plurality of requestors belongs to one of a plurality of classes of requestors; and means for arbitrating among said multiple SDRAM memory requests using heuristics dependent upon said classes of said requestors, creating a posted priority for each of said multiple SDRAM memory requests, and providing said memory request.

18. A method for processing variable length data transfers in a SDRAM as recited in claim 17 wherein when said current state is read in progress, said operation of handling said memory request includes:

means for waiting until said read in progress in a first bank is within a first number of data phases before its completion; and means for granting said memory request to a different bank if said memory request is a read of a highest posted priority.

19. A method for processing variable length data transfers in a SDRAM as recited in claim 18 further comprising:

means for waiting until said read in progress in said first bank is within a second number of data phases before its completion if said memory request is not a read of the highest posted priority; and means for granting said memory request to said different bank for one of a read memory request and a write memory request of said highest posted priority.

20. A method for processing variable length data transfers in a SDRAM as recited in claim 19 wherein said granting said memory request to said different bank for one of a read memory request and a write memory request includes:

means for granting a read memory request from said different bank if said read memory request is of said highest priority request posted.

21. A method for processing variable length data transfers in a SDRAM as recited in claim 20 wherein said granting said memory request to said different bank for one of a read memory request and a write memory request includes:

means for precharging a command state machine;

means for granting a write memory request from said different bank if said write memory request is of said highest priority request posted; and means for setting said current state to idle.

22. A method for processing variable length data transfers in a SDRAM as recited in claim 17 wherein when said current state is write in progress, said operation of handling said memory request includes:

means for waiting until said write in progress in a first bank is within a first number of data phases before its completion; and means for granting said memory request to a different bank if said memory request is a read of a highest posted priority.

23. A method for processing variable length data transfers in a SDRAM as recited in claim 22 further comprising:

means for waiting until said write in progress in said first bank is within a second number of data phases before its completion if said memory request is not a read of the highest posted priority; and means for granting said memory request to said different bank if said memory request is a write memory request of said highest posted priority.

24. A method for processing variable length data transfers in a SDRAM as recited in claim 23 further comprising:

means for waiting until said write in progress in said first bank is within a third number of data phases before its completion if said memory request is not a write of the highest posted priority; and means for precharging a command state machine; and means for setting said current state to idle.

25. A method for processing variable length data transfers in a SDRAM as recited in claim 17 wherein when said current state is idle, said operation of handling said memory request includes:

means for waiting until a memory request is posted; and means for granting said memory request to a different bank if said memory request is of a highest posted priority.

* * * * *

UNITED STATES PATENT AND TRADEMARK OFFICE
CERTIFICATE OF CORRECTION

PATENT NO.     : 6,219,747 B1  
DATED          : April 17, 2001  
INVENTOR(S)    : Jano D. Banks et al.

Page 1 of 1

It is certified that error appears in the above-identified patent and that said Letters Patent is hereby corrected as shown below:

<u>Title page,</u>
Item [73], please insert:
-- [73] Assignee: DVDO, Incorporated, Campbell, CA --

<u>Column 2,</u>
Line 3, change "of a" to -- of an --.

<u>Column 3,</u>
Line 23, change "of a" to -- of an --.

Signed and Sealed this

Twenty-fifth Day of November, 2003

JAMES E. ROGAN
*Director of the United States Patent and Trademark Office*